(12) United States Patent
Cheng et al.

(10) Patent No.: US 11,699,988 B2
(45) Date of Patent: Jul. 11, 2023

(54) RESONATOR AND METHOD FOR MANUFACTURING THE SAME

(71) Applicant: AAC ACOUSTIC TECHNOLOGIES (SHENZHEN) CO., LTD., Shenzhen (CN)

(72) Inventors: Shiyang Cheng, Shenzhen (CN); Ke Wu, Shenzhen (CN); Yang Li, Shenzhen (CN); Chao Wang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 425 days.

(21) Appl. No.: 16/993,198

(22) Filed: Aug. 13, 2020

(65) Prior Publication Data

US 2020/0412331 A1 Dec. 31, 2020

Related U.S. Application Data

(63) Continuation of application No. PCT/CN2019/093920, filed on Jun. 28, 2019.

(51) Int. Cl.
*H03H 9/17* (2006.01)
*H03H 3/02* (2006.01)
*H03H 9/13* (2006.01)

(52) U.S. Cl.
CPC ............. *H03H 9/175* (2013.01); *H03H 3/02* (2013.01); *H03H 9/13* (2013.01); *H03H 2003/025* (2013.01)

(58) Field of Classification Search
CPC ................................ H03H 9/175; H03H 9/13
See application file for complete search history.

(56) References Cited

U.S. PATENT DOCUMENTS

| | | | | |
|---|---|---|---|---|
| 2005/0093655 A1* | 5/2005 | Larson, III | ............. | H03H 9/132 333/191 |
| 2014/0118092 A1* | 5/2014 | Burak | .................... | H03H 9/175 333/187 |
| 2016/0352308 A1* | 12/2016 | Ivira | ...................... | H03H 9/173 |
| 2017/0026029 A1* | 1/2017 | Bahai | ..................... | H03H 9/205 |
| 2017/0033766 A1* | 2/2017 | Jacobsen | ................ | H03H 9/175 |

\* cited by examiner

*Primary Examiner* — Bryan P Gordon
(74) *Attorney, Agent, or Firm* — W&G Law Group

(57) ABSTRACT

A resonator includes a silicon substrate, a bottom electrode stacked on a portion of the silicon substrate, a piezoelectric layer covering the bottom electrode and another portion of the silicon substrate, a top electrode stacked on the piezoelectric layer, and a Bragg reflecting ring. The Bragg reflecting ring is formed on a side of the piezoelectric layer connected to the top electrode and surrounds the top electrode. The Bragg reflecting ring includes a Bragg high-resistivity layer and a Bragg low-resistivity layer alternately arranged along the radial direction of the Bragg reflecting ring. An acoustic impedance of the Bragg high-resistivity layer is greater than an acoustic impedance of the Bragg low-resistivity layer. The Bragg reflecting ring forms reflection surfaces to reflect the laterally propagating clutter waves, thereby suppressing the parasitic mode in the working frequency band, improving the frequency response curve of the resonator and the overall performance of the resonator.

7 Claims, 9 Drawing Sheets

$$\begin{bmatrix} 0 & 0 & 0 & 0 & d_{15} & 0 \\ 0 & 0 & 0 & d_{15} & 0 & 0 \\ d_{31} & d_{32} & d_{33} & 0 & 0 & 0 \end{bmatrix}$$

$$[d_{(AlN)}] =$$

$$\begin{bmatrix} 0 & 0 & 0 & 0 & -0.48 & 0 \\ 0 & 0 & 0 & -0.48 & 0 & 0 \\ -0.58 & -0.58 & 1.55 & 0 & 0 & 0 \end{bmatrix} C/m^2$$

FIG. 2

RESONATOR AND METHOD FOR MANUFACTURING THE SAME

FIELD OF THE DISCLOSURE

The present disclosure relates to the technical field of resonators, and in particular to a resonator and a method for manufacturing the same.

BACKGROUND OF THE DISCLOSURE

Resonators are electronic components that generate resonant frequency, and are commonly divided into quartz crystal resonators and ceramic resonators. The frequency generated by the resonator has the characteristics of good stability and good anti-interference performance and is therefore widely used in various electronic products.

With the development of technology, the quartz crystal resonators and ceramic resonators are not suitable for high-frequency and miniaturized products due to defects such as large volume and low frequency. Film bulk acoustic resonator (FBAR) manufactured by utilizing the longitudinal wave resonance which is excited along the thickness direction of a piezoelectric thin film material has excellent performances such as high frequency band, low power consumption, low temperature drift, low insertion loss, low noise, steep sideband, high power capacity, etc., and has become a new generation of resonator widely used. In addition, such type of piezoelectric thin film resonator can use processes compatible with CMOS, which can effectively reduce manufacturing cost and facilitate integration with CMOS circuits.

The piezoelectric thin film resonator includes an acoustic reflecting layer, two metal electrodes, and a piezoelectric thin film layer located between the two metal electrodes. The metal electrodes is configured to cause mechanical vibration of the piezoelectric thin film to excite resonance along the thickness direction thereof. The acoustic reflecting layer is configured to form effective acoustic isolation between two sides of the piezoelectric thin film resonator along the thickness direction and the outside and substrate.

FIG. 1 is a cross-sectional view of a conventional resonator. The resonator includes a silicon substrate 1, a bottom electrode 3, a piezoelectric layer 4 and a top electrode 5. A material of the piezoelectric layer 4 is aluminum nitride and a piezoelectric coefficient of the piezoelectric layer 4 is shown in FIG. 2. It can be seen from FIG. 2, the piezoelectric coefficient matrix is not limited to the Z-axis direction and there are components in other directions, which means that there are constrained modulus, tensile modulus, and shear modulus in the piezoelectric thin film at the same time when the resonator is in a working state, thereby generating acoustic waves which propagates longitudinally as well as acoustic waves which propagates laterally. As shown in FIG. 3 and FIG. 4, the acoustic waves propagating laterally will be reflected at an edge of the top electrode, and a plurality of resonance points of clutter waves are generated in an impedance curve of the resonator, especially in the working frequency band between two resonance peaks, thereby forming parasitic mode, which causes phase fluctuation in the working frequency band, affecting the performance of the resonator and in turn increasing ripple waves in the band of the wave filter.

Therefore, it is necessary to provide an improved resonator and a method for manufacturing the same.

SUMMARY OF THE DISCLOSURE

An object of the present disclosure is to provide a resonator and a method for manufacturing the same, aiming to improve a frequency response curve of the resonator.

The technical solutions of the present disclosure are as follows:

The present disclosure provides a resonator comprising a silicon substrate, a bottom electrode stacked on a portion of the silicon substrate, a piezoelectric layer covering the bottom electrode and another portion of the silicon substrate, a top electrode stacked on the piezoelectric layer, and a Bragg reflecting ring, the Bragg reflecting ring being formed on a side of the piezoelectric layer connected to the top electrode and surrounding the top electrode, the Bragg reflecting ring comprising a Bragg high-resistivity layer and a Bragg low-resistivity layer alternately arranged along the radial direction of the Bragg reflecting ring, an acoustic impedance of the Bragg high-resistivity layer being greater than an acoustic impedance of the Bragg low-resistivity layer.

Optionally, the number of the Bragg reflecting ring is multiple, and the multiple Bragg reflecting rings are arranged along the radial direction of the Bragg reflecting rings.

Optionally, the material of the Bragg high-resistivity layer comprises tungsten and carbon.

Optionally, the material of the Bragg low-resistivity layer comprises silicon oxide.

Optionally, a thickness of the Bragg high-resistivity layer is less than a thickness of the Bragg low-resistivity layer, and the thickness of the Bragg low-resistivity layer is less than a thickness of the top electrode.

Optionally, a cavity is defined at a side of the silicon substrate facing the bottom electrode.

Optionally, a projection of the Bragg reflecting ring along a direction from the top electrode to the piezoelectric layer is inside the cavity.

In addition, the present disclosure also provides a method for manufacturing a resonator, comprising steps:

providing a silicon substrate, etching a recessed cavity in the silicon substrate and filling a sacrificial material into the cavity, depositing and patterning to form a bottom electrode on a side of the silicon substrate with the cavity, depositing and patterning to form a piezoelectric layer on the bottom electrode, depositing and patterning to form a top electrode on the piezoelectric layer, and depositing and patterning to form a Bragg reflecting ring on the piezoelectric layer and top electrode, and the Bragg reflecting ring surrounding the top electrode.

Optionally, when the material of the Bragg reflector ring comprises a sacrificial material, the sacrificial material in the cavity is removed before depositing and patterning to form the Bragg reflecting ring on the piezoelectric layer and top electrode; when the material of the Bragg reflector ring does not comprise a sacrificial material, the sacrificial material in the cavity is removed after the Bragg reflecting ring are deposited and patterned on the piezoelectric layer and top electrode.

Optionally, the Bragg reflecting ring comprises a Bragg high-resistivity layer and a Bragg low-resistivity layer alternately arranged along the radial direction of the Bragg reflecting ring, an acoustic impedance of the Bragg high-resistivity layer is greater than an acoustic impedance of the Bragg low-resistivity layer, and depositing and patterning to form the Bragg reflecting ring on the piezoelectric layer and top electrode comprises steps:

depositing and patterning to form the Bragg low-resistivity layer on the piezoelectric layer and the top electrode, and depositing and patterning to form the Bragg high-resistivity layer on the piezoelectric layer, the top electrode, and the Bragg low-resistivity layer.

The present disclosure has the advantages that: the resonator of the present disclosure includes a silicon substrate, a bottom electrode, a piezoelectric layer, a top electrode and a Bragg reflector ring formed successively, and the silicon substrate defines a cavity at a side thereof facing the bottom electrode. The Bragg reflecting ring is formed on a side of the piezoelectric layer connected to the top electrode, and surrounds the top electrode. The Bragg reflecting ring includes a Bragg high-resistivity layer and a Bragg low-resistivity layer alternately arranged along the radial direction of the Bragg reflecting ring. Acoustic impedances of the Bragg high-resistivity layer and the Bragg low-resistivity layer are different from each other. The Bragg reflecting ring with alternating high and low acoustic impedances can form a plurality of reflection surfaces, and the clutter waves propagating laterally all reflect at these reflection surfaces. The reflected clutter waves cancel out each other, thereby suppressing the parasitic mode in the working frequency band, improving the frequency response curve of the resonator and reducing filtering, and improving the overall performance of the resonator.

BRIEF DESCRIPTION OF THE DRAWINGS

FIG. 2 is a piezoelectric coefficient matrix of a piezoelectric layer of the conventional resonator, the piezoelectric layer being made of aluminum nitride.

References numerals in the specification are as follows:

| | |
|---|---|
| silicon substrate | 1 |
| cavity | 11 |
| bottom electrode | 3 |
| piezoelectric layer | 4 |
| top electrode | 5 |
| Bragg reflecting ring | 6 |
| Bragg high-resistivity layer | 61 |
| Bragg low-resistivity layer | 62 |

DETAILED DESCRIPTION OF THE PREFERRED EMBODIMENTS

The present disclosure will be further described below with reference to the drawings and embodiments.

Figure 1:
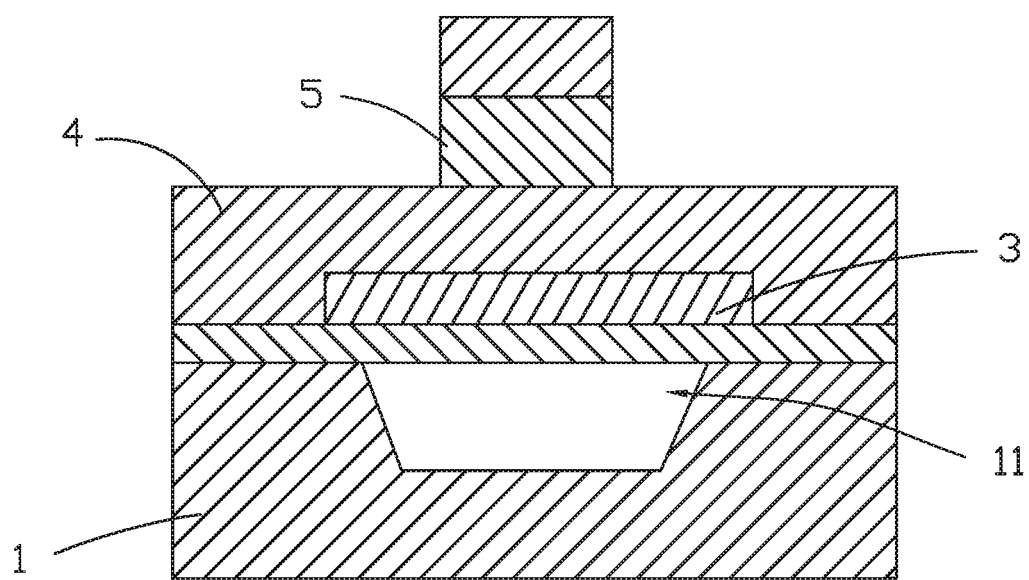
FIG. 1 is a cross-sectional view of a conventional resonator.
Figure 3:
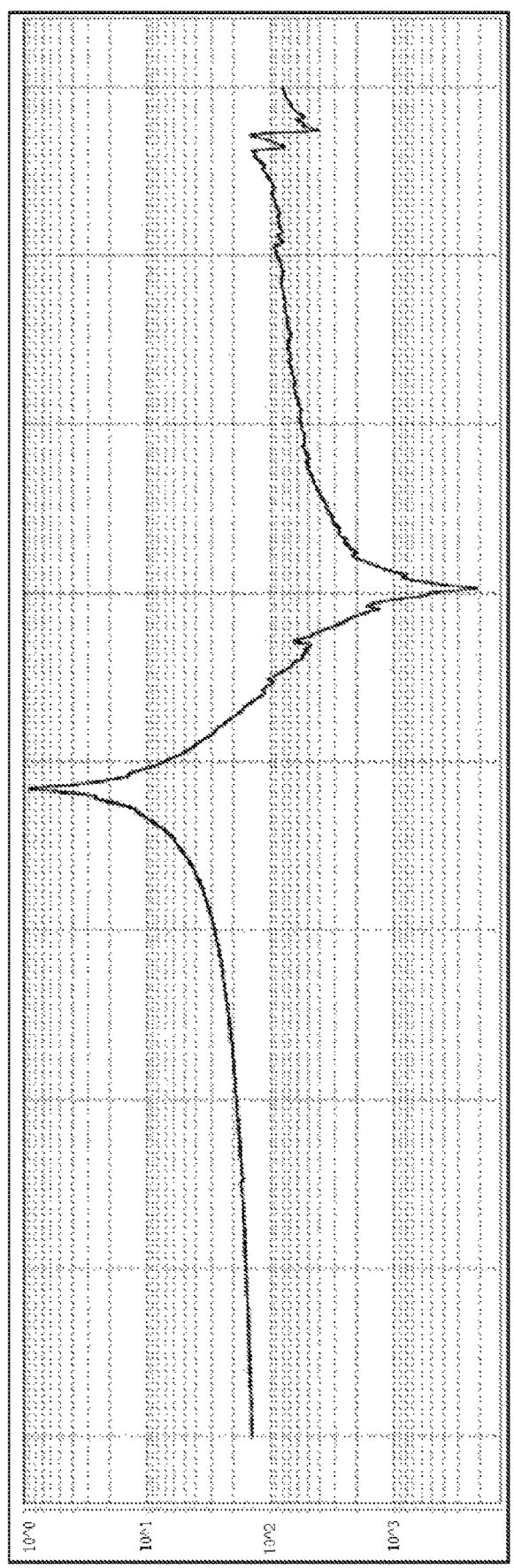
FIG. 3 is a simulation diagram of a frequency response curve of the conventional resonator.
Figure 4:
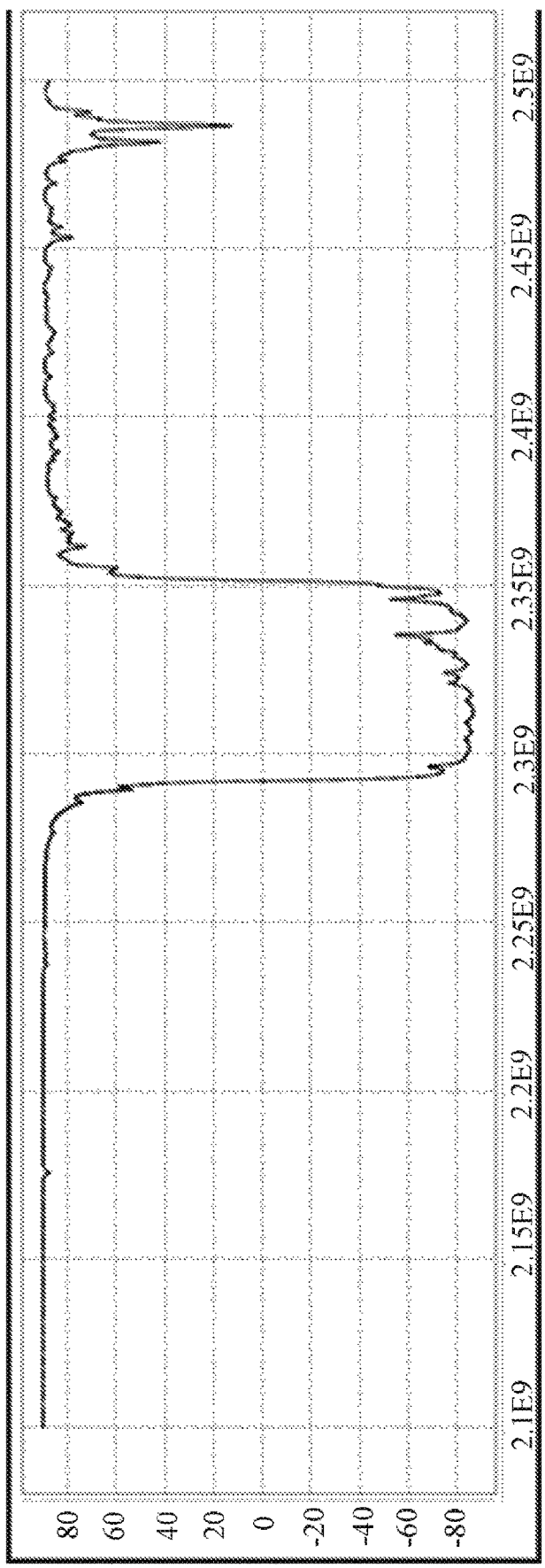
FIG. 4 is a simulation diagram of a phase angle of the conventional resonator.
Figure 5:
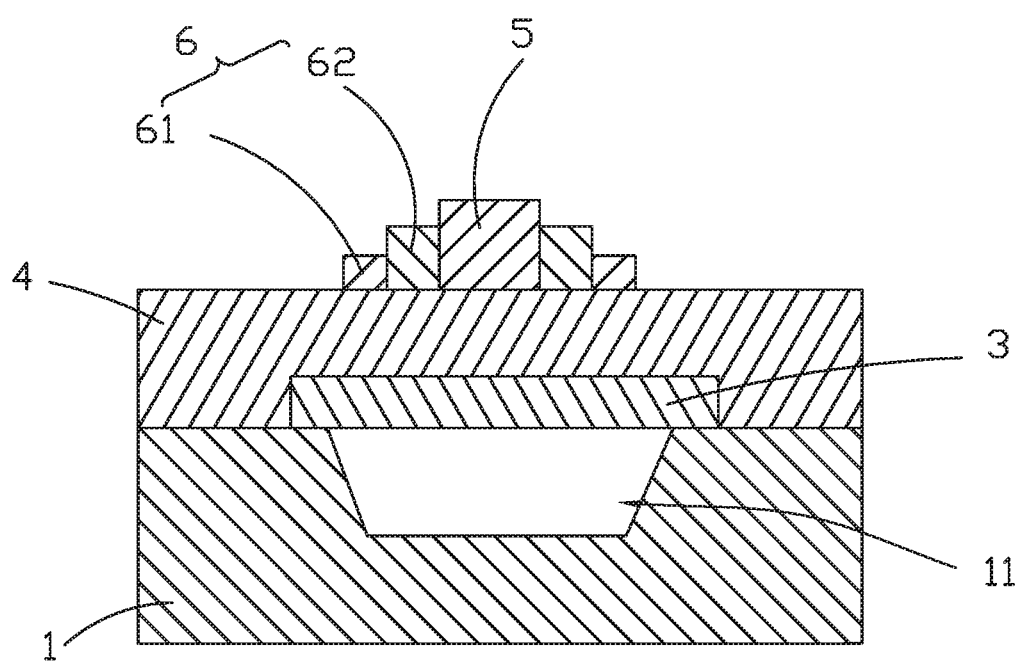
FIG. 5 is a cross-sectional view of a resonator according to an embodiment of the present disclosure.

As shown in FIG. 5, a resonator according to an embodiment of the present disclosure includes a silicon substrate 1, a bottom electrode 3 stacked on a portion of the silicon substrate 1, a piezoelectric layer 4 covering the bottom electrode 3 and another portion of the silicon substrate 1, a top electrode 5 and a Bragg reflecting ring 6 stacked on the piezoelectric layer 4.

The piezoelectric layer 4 is made of an aluminum nitride film. The aluminum nitride film is an excellent piezoelectric material which has high temperature resistance, stable chemical properties, and good insulation performance. Further, the aluminum nitride film has a large electromechanical coupling coefficient, high acoustic velocity and good high-frequency performance, being suitable for making surface acoustic wave (SAW) devices.

The Bragg reflecting ring 6 is formed on a side of the piezoelectric layer 4 connected to the top electrode 5, and surrounds the top electrode 5. The Bragg reflecting ring 6 includes a Bragg high-resistivity layer 61 and a Bragg low-resistivity layer 62 that are alternately arranged in the radial direction of the Bragg reflecting ring 6. Acoustic impedances of the Bragg high-resistivity layer 61 and the Bragg low-resistivity layer 62 are different from each other, wherein the acoustic impedance of the Bragg high-resistivity layer 61 is greater than the acoustic impedance of the Bragg low-resistivity layer 62. The Bragg reflecting ring 6 with alternating high and low acoustic impedances can form a plurality of reflection surfaces, and the laterally propagating clutter waves all are partly reflected at these reflection surfaces. The reflected clutter waves cancel each other out, thereby suppressing the parasitic mode in the working frequency band, improving the frequency response curve of the resonator and reducing filtering, and improving the overall performance of the resonator.

Specifically, the Bragg reflection ring 6 applies the principle of Bragg reflection. Bragg reflection means that periodic reflection points are formed on an interface of two different medias, thus to generate periodic reflection, making the laterally propagating clutter waves cancel each other out.

Figure 7:
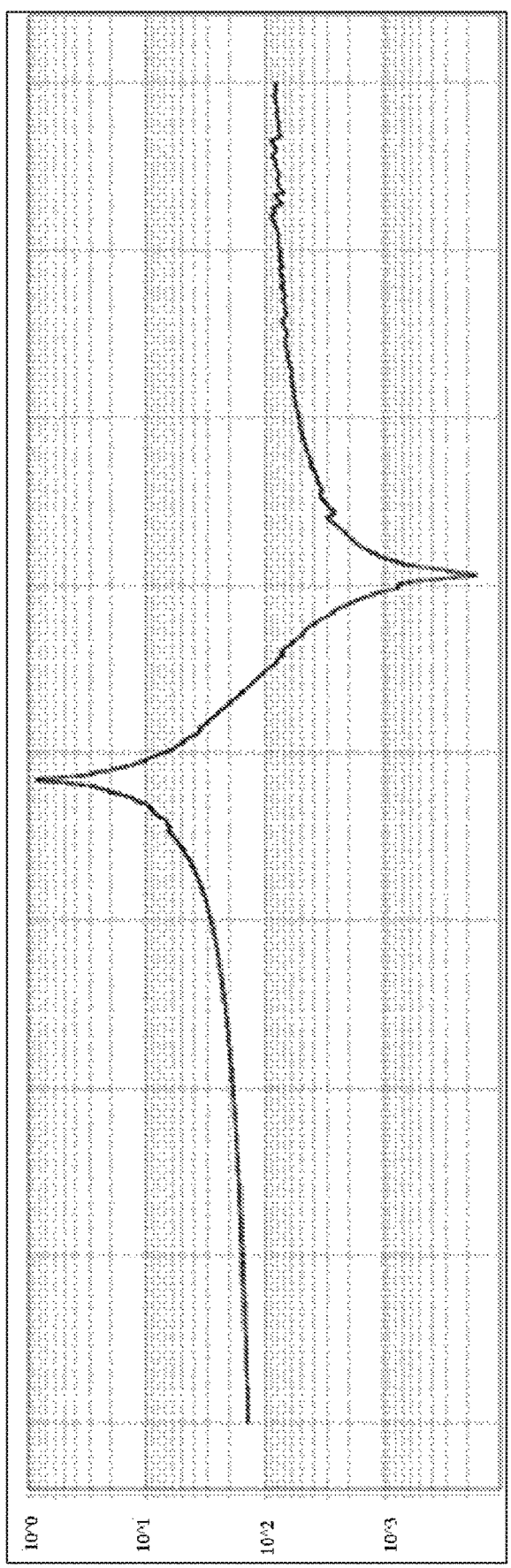
FIG. 7 is a simulation diagram of a frequency response curve of the resonator of an embodiment of the present disclosure.
Figure 8:
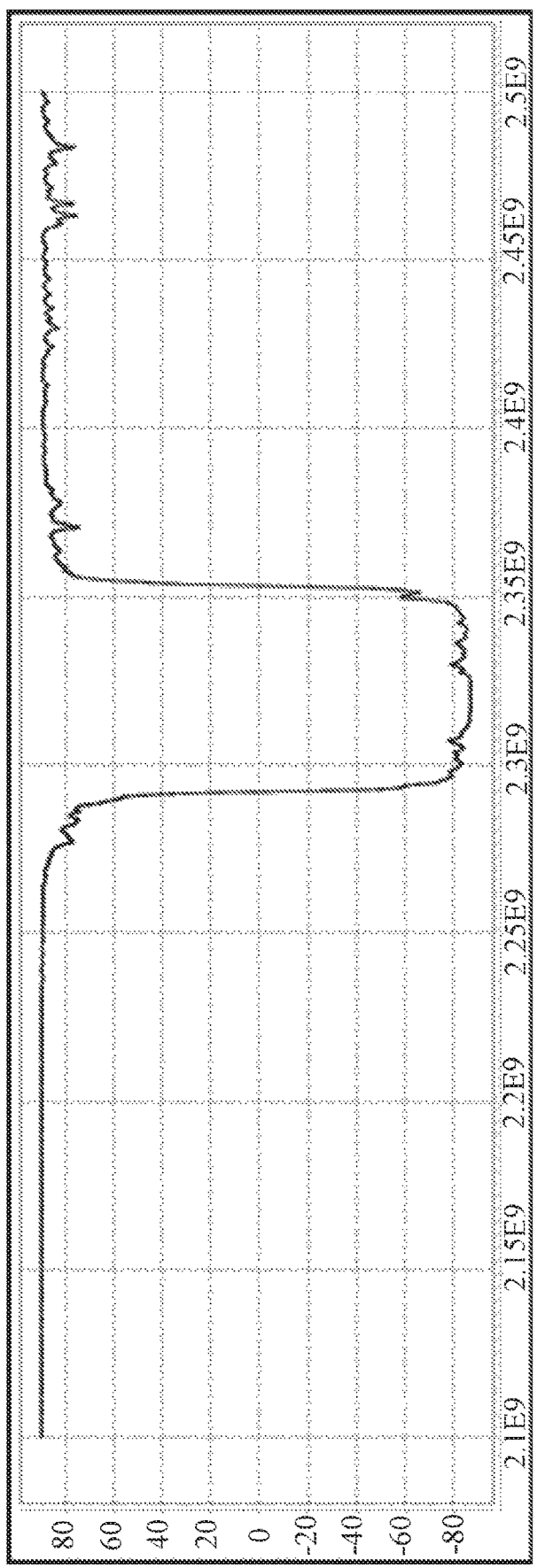
FIG. 8 is a simulation diagram of a phase angle of the resonator of an embodiment of the present disclosure.

As shown in FIG. 7 and FIG. 8, it can be seen from the simulation results that: compared with the conventional resonator, the resonator of the present disclosure applies the Bragg reflecting ring 6 to suppress the parasitic mode in the working frequency band by multiple times of reflection of the laterally propagating clutter waves, making a phase angle of the resonator of the present disclosure in the working frequency band be smoother than a phase angle of the conventional resonator.

Figure 6:
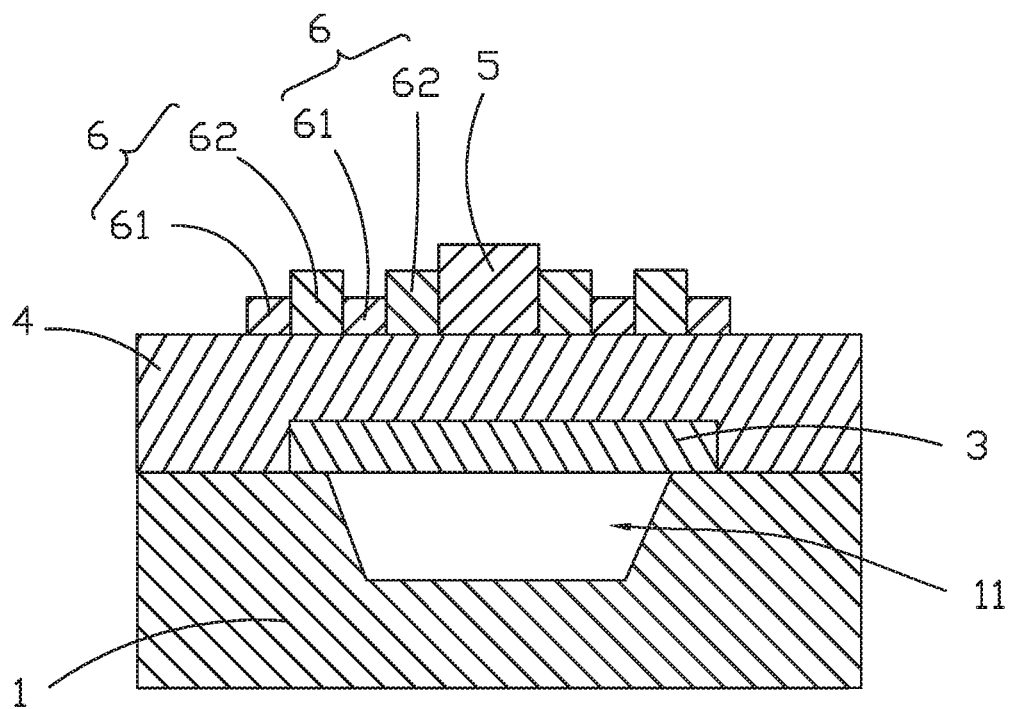
FIG. 6 is a cross-sectional view of a resonator according to an alternative embodiment of the present disclosure.

As shown in FIG. 5, in this embodiment, the number of the Bragg reflecting ring 6 is one. In other embodiments, as shown in FIG. 6, there can be two Bragg reflecting rings 6. Of course, the number of the Bragg reflecting rings 6 can also be more than three.

In this embodiment, the material of the Bragg high-resistivity layer 61 includes tungsten and carbon, and the material of the Bragg low-resistivity layer 62 at least includes silicon oxide. The chemical properties of tungsten, carbon, and silicon oxide are relatively stable, which improve a stability of the resonator. Moreover, the reserves of tungsten, carbon and silicon oxide are large, which facilitates to reduce the manufacturing cost.

As shown in FIG. 5, a thickness of the Bragg high-resistivity layer 61 is less than a thickness of the Bragg low-resistivity layer 62. The thickness of the Bragg low-resistivity layer 62 is less than a thickness of the top electrode 5. The Bragg reflecting ring 6 with alternating high and low acoustic impedances can form a plurality of reflection surfaces, and the laterally propagating clutter waves are reflected at these reflection surfaces partly. At the same time, constructing the reflecting ring 6 having multiple layers with different height can also increase the total reflection area in the longitudinal/vertical direction to counteract more laterally propagating clutter waves. Moreover, by appropriately adjusting the thickness and width of each Bragg reflecting ring 6, the clutter waves reflected by different reflecting rings 6 can cancel out each other, thereby suppressing the parasitic mode in the working frequency band.

Of course, in other embodiments, the thickness of the Bragg high-resistivity layer 61 of the Bragg reflecting ring 6 may also be equal to or greater than the thickness of the Bragg low-resistivity layer 62, and the number of layers of Bragg high-resistance layers 61 and Bragg low-resistivity layer 62 and the width of each layer can also be determined according to actual needs to suppress the parasitic mode in the working frequency band.

In this embodiment, a cavity 11 is defined at a side of the silicon substrate 1 facing the bottom electrode 3. A projection of the Bragg reflecting ring 6 in the direction from the top electrode 5 to the piezoelectric layer 4 is located inside of the cavity 11. In other embodiments, the projection of the Bragg reflecting ring 6 in the direction from the top electrode 5 to the piezoelectric layer 4 may also be located outside of the cavity 11. Of course, the projection of the Bragg reflecting ring 6 in the direction from the top electrode 5 to the piezoelectric layer 4 may also be partly inside of the cavity 11 and the remaining part being outside the cavity 11.

Figure 9:
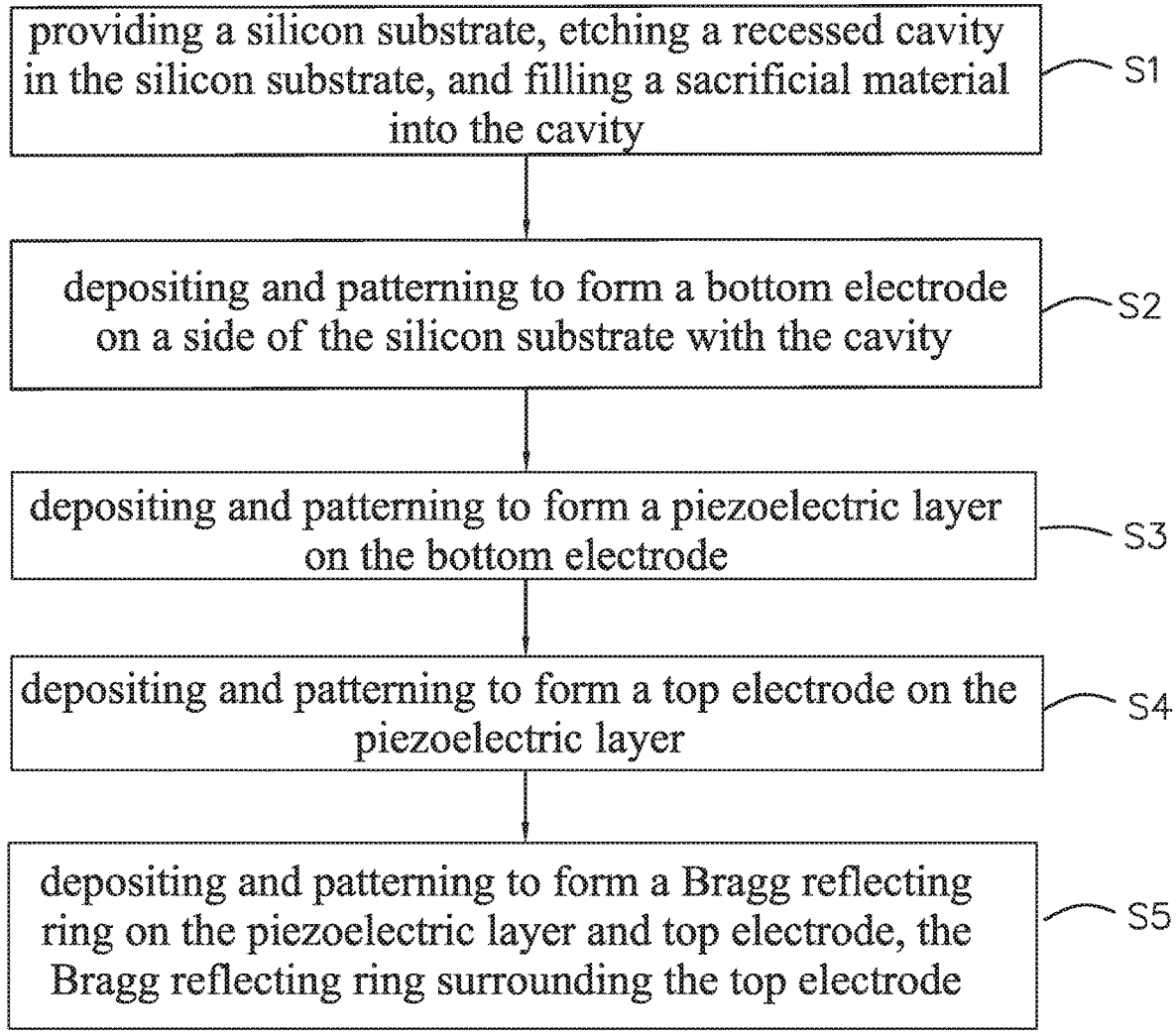
FIG. 9 is a flowchart of a method for manufacturing a resonator according to an embodiment of the present disclosure.

In addition, the present disclosure also provides a method for manufacturing a resonator. As shown in FIG. 9, the method includes the following steps:

S1: providing a silicon substrate 1, etching a recessed cavity 11 in the silicon substrate 1, and filling a sacrificial material into the cavity 11, S2: depositing and patterning to form a bottom electrode 3 on a side of the silicon substrate 1 with the cavity 11, S3: depositing and patterning to form a piezoelectric layer 4 on the bottom electrode 3, S4: depositing and patterning to form a top electrode 5 on the piezoelectric layer 4, and S5: depositing and patterning to form a Bragg reflecting ring 6 on the piezoelectric layer 4 and top electrode 5, the Bragg reflecting ring 6 surrounding the top electrode 5.

It should be noted that: when the material of the Bragg reflector ring 6 includes a sacrificial material, the sacrificial material in the cavity 11 is removed before S5: depositing and patterning to form the Bragg reflecting ring 6 on the piezoelectric layer 4 and top electrode 5.

When the material of the Bragg reflector ring 6 does not includes a sacrificial material, the sacrificial material in the cavity 11 is removed after the Bragg reflecting ring 6 being deposited and patterned on the piezoelectric layer 4 and top electrode 5.

It is worth mentioning that, in this embodiment, the Bragg low-resistivity layer 62 is formed before the Bragg high-resistivity layer 61. Specifically, the Bragg low-resistivity layer 62 is deposited and patterned on the piezoelectric layer 4 and the top electrode 5, and then the Bragg high-resistivity layer 61 is deposited and patterned on the piezoelectric layer 4, the top electrode 5 and the Bragg low-resistivity layer 62.

In this embodiment, the sacrificial material is silicon dioxide. By filling the cavity 11 with silicon dioxide, it is convenient to deposit and pattern the bottom electrode 3 on the silicon substrate 1.

The electrode material of the bottom electrode 3 and the top electrode 5 includes molybdenum and titanium, which can effectively prolong the service life of the bottom electrode 3 and the top electrode 5. Further, a power consumption of titanium electrode is small, which can effectively save resources.

The above are only embodiments of the present disclosure. It should be noted that those of ordinary skill in the art can make improvements without departing from the inventive concept of the present disclosure, but these improvements should be within the protection scope of the present disclosure.

The invention claimed is:

1. A resonator comprising:
   a silicon substrate;
   a bottom electrode stacked on a portion of the silicon substrate;
   a piezoelectric layer covering the bottom electrode and another portion of the silicon substrate;
   a top electrode stacked on the piezoelectric layer; and
   a Bragg reflecting ring, the Bragg reflecting ring being formed on a side of the piezoelectric layer connected to the top electrode and surrounding the top electrode;
   wherein the Bragg reflecting ring comprises a Bragg high-resistivity layer and a Bragg low-resistivity layer alternately arranged along a radial direction of the Bragg reflecting ring, an acoustic impedance of the Bragg high-resistivity layer being greater than an acoustic impedance of the Bragg low-resistivity layer.

2. The resonator of claim 1, wherein the number of the Bragg reflecting ring is multiple, and the multiple Bragg reflecting rings are arranged along the radial direction of the Bragg reflecting rings.

3. The resonator of claim 1, wherein the material of the Bragg high-resistivity layer comprises tungsten and carbon.

4. The resonator of claim 1, wherein the material of the Bragg low-resistivity layer comprises silicon oxide.

5. The resonator of claim 1, wherein a thickness of the Bragg high-resistivity layer is less than a thickness of the Bragg low-resistivity layer, and the thickness of the Bragg low-resistivity layer is less than a thickness of the top electrode.

6. The resonator of claim 1, wherein a cavity is defined at a side of the silicon substrate facing the bottom electrode.

7. The resonator of claim 6, wherein a projection of the Bragg reflecting ring along a direction from the top electrode to the piezoelectric layer is inside the cavity.

\* \* \* \* \*